US010543657B2

(12) United States Patent
Lin et al.

(10) Patent No.: US 10,543,657 B2
(45) Date of Patent: Jan. 28, 2020

(54) MULTILAYER STRUCTURES FOR ELECTRONIC DEVICE HOUSINGS

(71) Applicant: HEWLETT-PACKARD DEVELOPMENT COMPANY, L.P., Houston, TX (US)

(72) Inventors: Hsiu-Pen Lin, Taipei (TW); Kun-Cheng Tsai, Taipei (TW); Chienchih Chiu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/067,729

(22) PCT Filed: Apr. 5, 2016

(86) PCT No.: PCT/US2016/025951
§ 371 (c)(1),
(2) Date: Jul. 2, 2018

(87) PCT Pub. No.: WO2017/176250
PCT Pub. Date: Oct. 12, 2017

(65) Prior Publication Data
US 2019/0016082 A1  Jan. 17, 2019

(51) Int. Cl.
*B32B 3/06* (2006.01)
*B32B 15/08* (2006.01)
*B29C 45/00* (2006.01)
*B29C 45/14* (2006.01)
*B29C 45/16* (2006.01)
*G06F 1/16* (2006.01)
*H05K 5/02* (2006.01)

(52) U.S. Cl.
CPC ............ *B32B 3/06* (2013.01); *B29C 45/0001* (2013.01); *B29C 45/14639* (2013.01); *B29C 45/16* (2013.01); *B32B 15/08* (2013.01); *G06F 1/1601* (2013.01); *G06F 1/1616* (2013.01); *H05K 5/02* (2013.01)

(58) Field of Classification Search
CPC .................................................. B32B 3/06
USPC ......................................................... 428/98
See application file for complete search history.

(56) References Cited

U.S. PATENT DOCUMENTS

| 5,354,951 A | 10/1994 | Lange |
| 6,313,400 B1 | 11/2001 | Mosquera |
| 6,574,096 B1 | 6/2003 | Difonzo et al. |
| 6,628,530 B2 | 9/2003 | Takay |
| 8,718,731 B1 | 5/2014 | Tang |

(Continued)

FOREIGN PATENT DOCUMENTS

| CN | 104320931 | 1/2015 |
| WO | WO-2015134588 A1 | 9/2015 |

*Primary Examiner* — Brent T O'Hern
(74) *Attorney, Agent, or Firm* — Brooks Cameron & Huebsch PLLC

(57) ABSTRACT

In one example, a housing for an electronic device may be disclosed which may include a first multi-layer structure. The first multi-layer structure may include a first layer and a second layer formed on the first layer. Each of the first layer and the second layer may include a plurality of protruding features and a plurality of recessing features on an edge of the first layer and the second layer. At least one of the plurality of recessing features of one layer may intersect at least one of the plurality of protruding features of other layer.

15 Claims, 3 Drawing Sheets

(56) References Cited

U.S. PATENT DOCUMENTS

| | | | |
|---|---|---|---|
| 8,861,191 B1 | 10/2014 | Yu et al. | |
| 9,232,031 B1 | 1/2016 | Shoval et al. | |
| 2002/0015295 A1 | 2/2002 | Takaya et al. | |
| 2010/0238621 A1 | 9/2010 | Tracy et al. | |
| 2011/0008566 A1 | 1/2011 | Okano et al. | |
| 2012/0049700 A1* | 3/2012 | Cochrane | H05K 9/0049 312/223.2 |
| 2013/0242487 A1 | 9/2013 | Fujioka et al. | |
| 2014/0071651 A1 | 3/2014 | Wittenberg et al. | |
| 2015/0366088 A1 | 12/2015 | Wu et al. | |
| 2016/0048172 A1 | 2/2016 | He et al. | |
| 2016/0174420 A1* | 6/2016 | Cochrane | H05K 9/0009 361/818 |

\* cited by examiner

MULTILAYER STRUCTURES FOR ELECTRONIC DEVICE HOUSINGS

BACKGROUND

Electronic devices may include a housing for enclosing or securing various device components and circuitry. The characteristics of housings may vary from device to device. For example, housings for computers, phones, and keyboards are generally different, and may be formed using different materials and assembly techniques.

BRIEF DESCRIPTION OF THE DRAWINGS

Examples are described in the following detailed description and in reference to the drawings, in which.

DETAILED DESCRIPTION

Housings for computers, phones, and keyboards may be generally different, and may be formed using different materials and assembly techniques. Housings may be formed of metal and plastic bonding to save cost and to keep the devices lighter. In some electronic devices, housings may be formed of metal and plastic bonding to allow transmission/reception of wireless antenna signals. Despite the variation in construction, some housings may have generally formed from two or more housing parts that are fixed together, which may cause a cosmetic issue (e.g., bonding may gradually fail over time) due to material bonding force between the housing parts lower than external loading. For example, in notebook computers, the cosmetic issue may be caused due to less spacing for insert molding zipper structure between the housing parts, varied cosmetic painting process or high temperatures involved in finishing process.

Examples described herein may describe a housing for an electronic device, which may include a first multi-layer structure and a second multi-layer structure. In one example, the first multi-layer structure may include a first layer and a second layer formed on the first layer. Each of the first layer and the second layer may include a plurality of protruding features and a plurality of recessing features on an edge of the first multi-layer structure. Example protruding features and recessing features on the first layer and the second layer may be "T" shaped, mushroom shaped, rectangular shaped or a combination thereof.

In one example, at least one of the recessing features of one layer may intersect at least one of the protruding features of other layer. For example, at least one recessing feature of the first layer may intersect the at least one protruding feature of the second layer. The second multi-layer structure may be bonded to the first multi-layer structure through the plurality of protruding features and the plurality of recessing features on the edge of the first multi-layer structure to provide a bonding force in x, y and z directions. The intersecting portion of the first layer and the second layer can help to constrain each of the first layer and the second layer and enhance the bonding force between the first and the second multi-layer structures. The multi-layer structure described herein may also protect against the external load and hence may reduce/overcome the cosmetic issue.

Figure 1A:
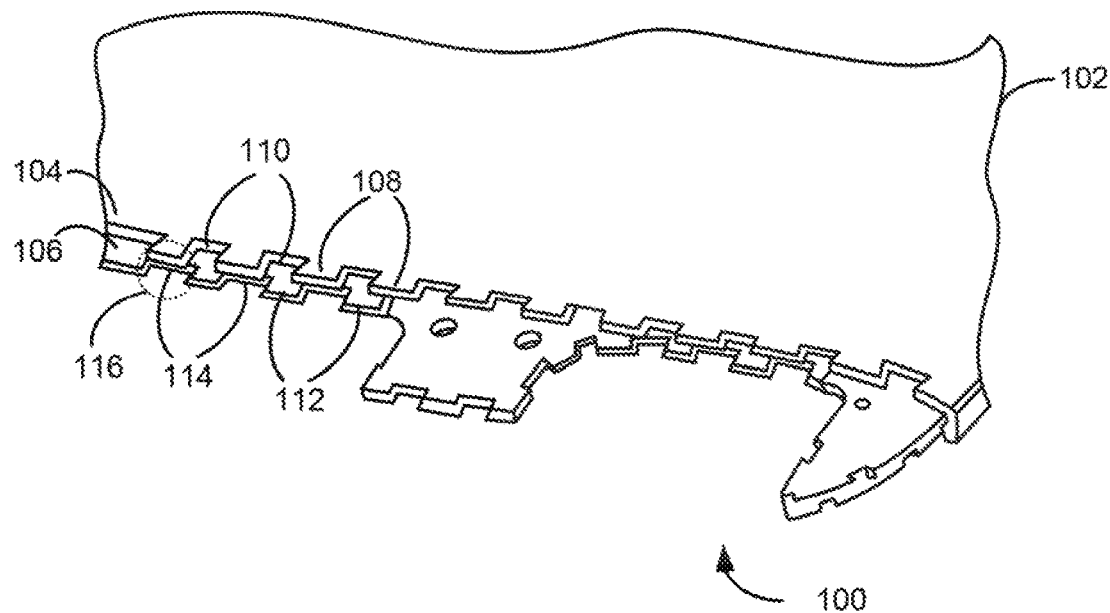
FIG. 1A is a perspective view of an example housing depicting a multi-layer structure.
Figure 1B:
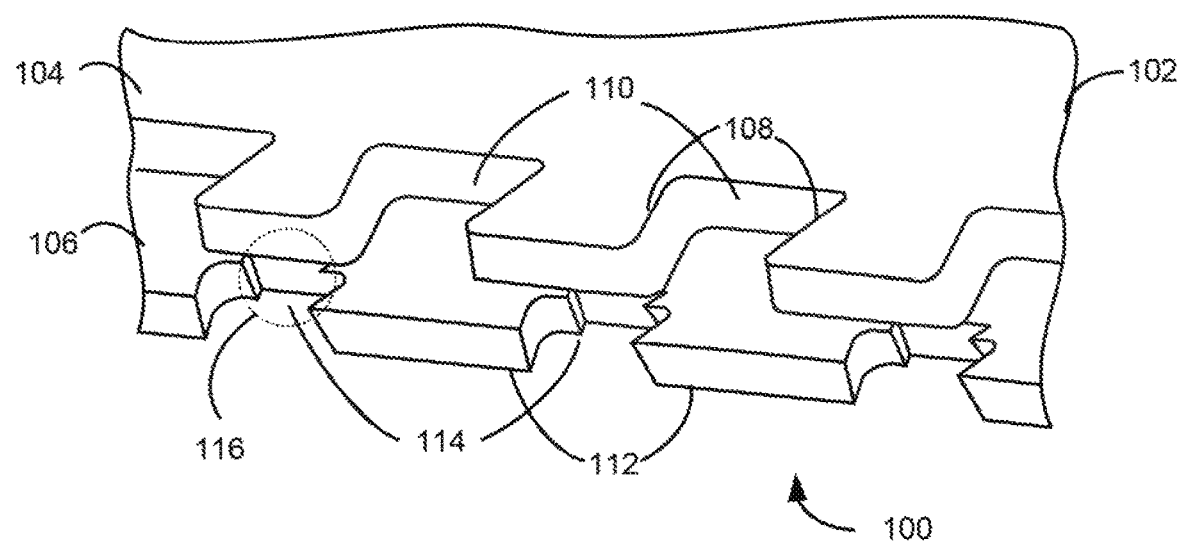
FIG. 1B depicts a top view of a portion of the example multi-layer structure shown in FIG. 1.
Figure 1C:
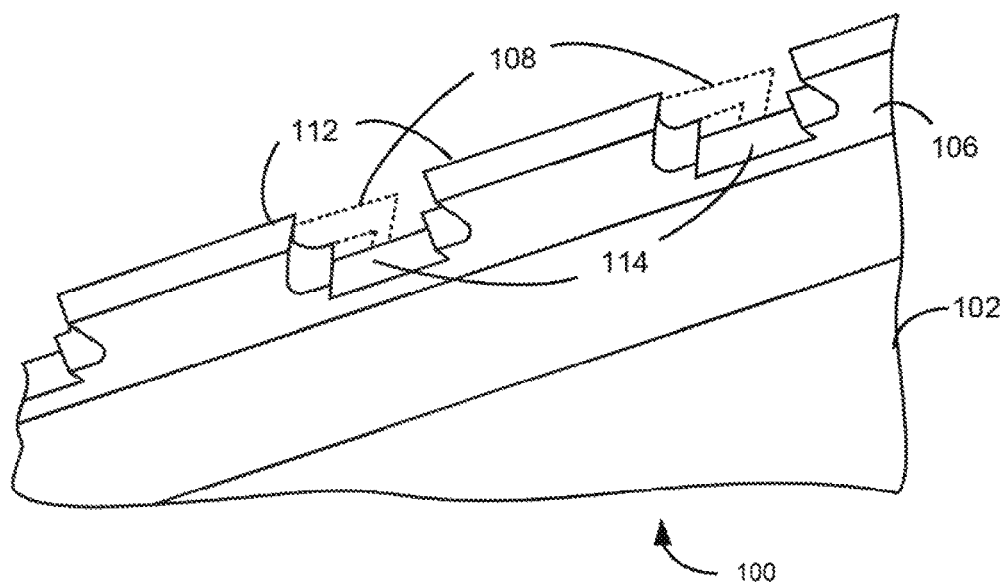
FIG. 1C depicts a bottom view of a portion of the example multi-layer structure shown in FIG. 1.

FIGS. 1A-1C depict an example housing 100 depicting a multi-layer structure 102. Particularly, FIG. 1A is a perspective view of an example housing 100 depicting a multi-layer structure 102. FIG. 1B depicts a top view of a portion of example multi-layer structure 102 shown in FIG. 1A. FIG. 1C depicts a bottom view of a portion of example multi-layer structure 102 shown in FIG. 1A. Multi-layer structure 102 can, for example, represent a material utilized as housing of the electronic device. Housing 100 may include a first multi-layer structure 102. First multi-layer structure 102 may include a first layer 106 and a second layer 104 formed on first layer 106. For example, different layers of first multi-layer structure 102 can be made of different materials (e.g., different metals) or same material. First multi-layer structure 102 that is a portion of housing 100 may be a bezel section, a front section, and/or a back section of the housing 100.

First layer 106 may include protruding features 112 and recessing features 114 on an edge of first layer 106. Second layer 104 may include protruding features 108 and recessing features 110 on an edge of second layer 104. In one example, at least one of recessing features 114 of one layer (e.g., first layer 106) may intersect (e.g., as shown in intersecting portion 116) at least one of protruding features 108 of other layer (e.g., second layer 104). In another example, at least some portion of recessing features 114 of first layer 106 may overlap with at least some portion of protruding features 108 of second layer 104. Protruding features 108, 112 and recessing features 110, 114 of first layer 106 and second layer 104 may form a dual-layer zipper structure. In each layer, a recessing feature (e.g., 110, 114) may be formed between two protruding features (e.g., 108, 112) to form a zipper structure.

Figure 2:
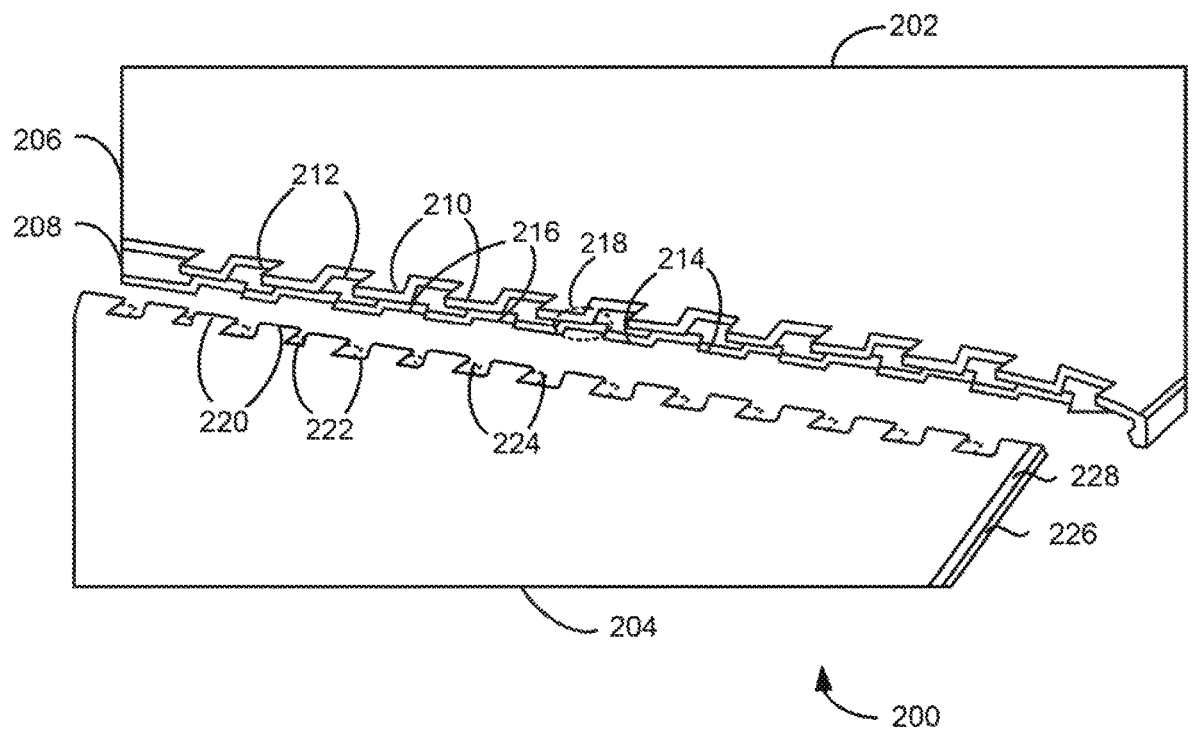
FIG. 2 depicts a perspective view of an example multi-layer structure assembly.

Further, housing 100 may include a second multi-layer structure (e.g., 204 as shown in FIG. 2). In one example, second multi-layer structure may be bonded to first multi-layer structure 102 using protruding features 108, 112 and recessing features 110, 114 on the edge of first layer 106 and second layer 104. This is explained in detail in FIG. 2.

Referring now to FIG. 2, which depicts a perspective view of an example multi-layer structure assembly 200. Assembly 200 may include a first multi-layer structure 202 and a second multi-layer structure 204 that can be bonded to first multi-layer structure 202. First multi-layer structure 202 may include a first layer 208 and a second layer 206 integrally formed on first layer 208. First layer 208 and second layer 206 may be metal layers that are laminated together. First layer 208 and second layer 206 can utilize different metals. First multi-layer structure 202 may be made by metal manufacturing methods such as compression molding, casting, pressing forming, forging, and punching.

Each of first layer 208 and second layer 206 may include at least one protruding feature 210, 214 and at least one recessing feature 212, 216 on an edge of first multi-layer structure 202. Protruding features 214 of first layer 208 may be substantially offset from protruding features 210 of second layer 206 and recessing features 216 of first layer 208 may be substantially offset from recessing features 212 of second layer 206. In one example, recessing features 216 of one layer (e.g., first layer 208) may intersect (e.g., as shown in intersecting portion 218) protruding features 210 of other layer (e.g., second layer 206).

Second multi-layer structure 204 may be bonded to first multi-layer structure 202 via protruding features 210, 214 and recessing features 212, 216 on the edge of first multi-layer structure 202 to provide a bonding force. In one example, second multi-layer structure 204 may be insert molded onto protruding features 210, 214 and recessing features 212, 216 on edge of first multi-layer structure 202. First multi-layer structure 202 and second multi-layer structure 204 may be joined together without gaps. For example, in insert molding process, metallic multi-layer structure (e.g., 202) may accept the flow of melted plastic multi-layer structure (e.g., 204) into recessing features and the plastic may be hardened while the melted plastic multi-layer structure is inside the recessing features, thereby attaching the plastic multi-layer structure to the metallic multi-layer structure. Examples for attaching first and second multi-layer structures may not be limited to insert molding and any other process (e.g., Ultrasonic bonding) may be used for attaching first and second multi-layer structures such that first and second multi-layer structures may form a housing for electronic device.

For example, second multi-layer structure 204 may include a first and second layers 226, 228 with each of first and second layers 226, 228 having protruding features 220, 224 and recessing features 222. Protruding features 220, 224 of second multi-layer structure 204 may be disposed within the corresponding recessing features 212, 216 of first multi-layer structure 202. Similarly, protruding features 210, 214 of first multi-layer structure 202 may be disposed within the corresponding recessing features (e.g., 222) of first layer 226 and the second layer 228 of second multi-layer structure 204. In the example shown in FIG. 2, the recessing features of inner layer (e.g., first layer 226) may not be visible.

First multi-layer structure 202 and second multi-layer structure 204 may be made up of a same material or a different material. In one example, first multi-layer structure 202 may be made up of a metallic material and second multi-layer structure 204 may be made up of a plastic material. For example, first multi-layer structure 202 may be made up of a metallic material selected from a group consisting of aluminum, magnesium, lithium, zinc, titanium, aluminum alloy, magnesium alloy, lithium alloy, zinc alloy, and titanium alloy. Second multi-layer structure 204 may be made up of a plastic material selected from a group consisting of liquid crystal polymer, polyphenylene sulphide, and poly butylene terephthalate. Also, material of second multi-layer structure 204 can be selected to have a good bonding ability with material of first multi-layer structure 202. For example, the plastic portion may substantially an elongated portion adjacent to one edge of the metallic body. The plastic portion may be made of a material which can be able to firmly bond with the metallic body, for example, a material with relatively low shrinkage and a linear expansion coefficient substantially equal to that of the metallic material of first multi-layer structure 202. For instance, protruding features (e.g., 210, 214) that extend from the edge of the metal part may allow the moldable plastic material to adhere to the protruding features, hence, may have an increased binding area that allows the moldable plastic material to bind to the metal part. Even though the examples in FIGS. 1 and 2 may describe the multi-layer structure as including two layers, the multi-layer structure can include more than two layers.

Further, painting process may be performed on the first and second multi-layer structures 202, 204 to form a shadowless housing. For example, the painting process may include powder coating, base coating, and the top coating (e.g., paint coating).

Figure 3:
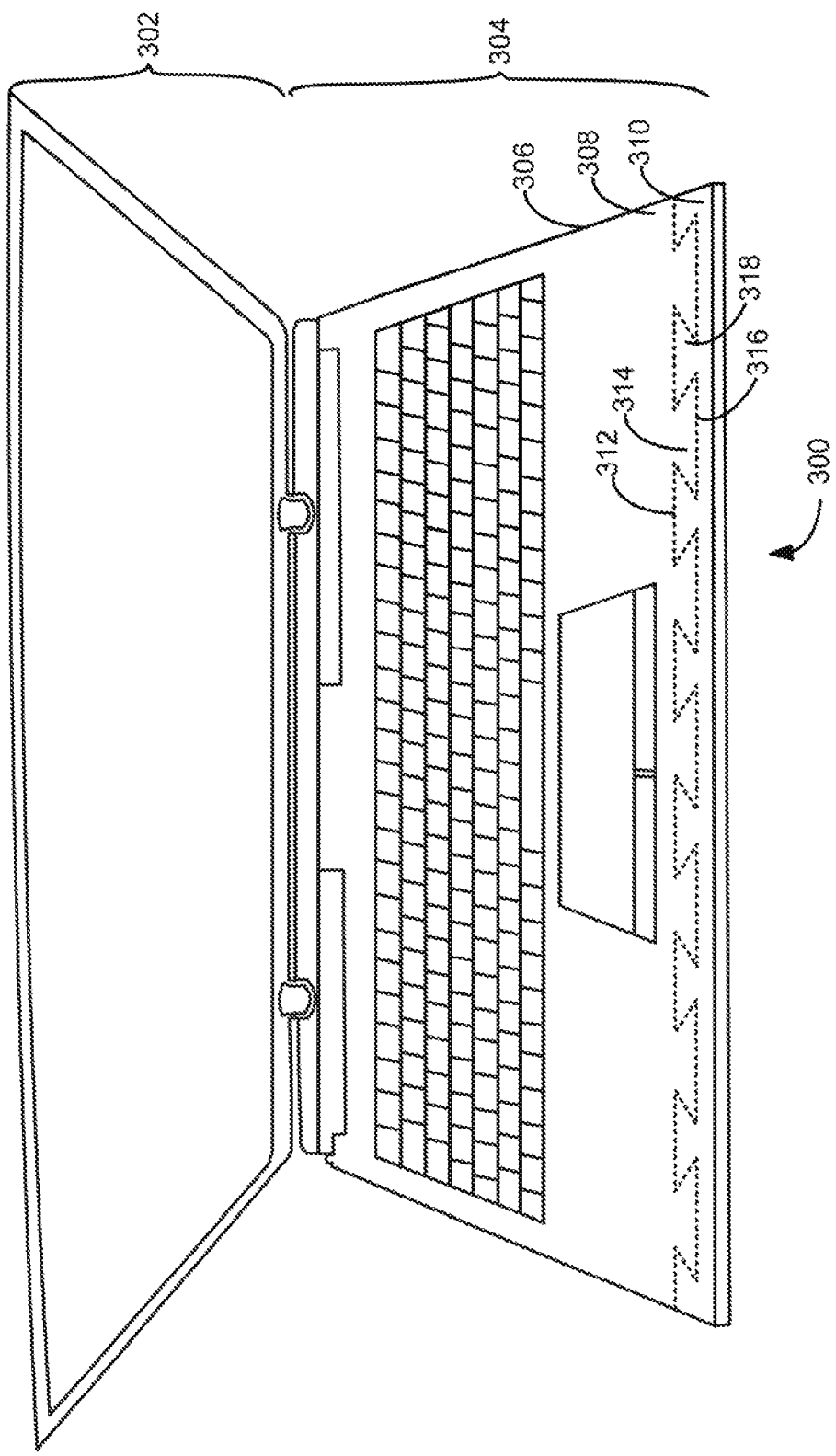
FIG. 3 depicts an example portable electronic device including a housing formed using the multi-layer structure assembly.

FIG. 3 illustrates an example portable electronic device 300. Electronic device 300 may include a base 304 and a display 302. Base 304 may include a keyboard, touch pad and other electronic components, such as processor, battery, memory, mother board and the like. Base 304 may include a housing 306 arranged to substantially house the electronic components. Example electronic devices 300 may include notebook computers, tablet computers, mobile phones, media players, personal digital assistants (PDAs), and the like.

In one example, housing 306 may be formed of a first multi-layer structure 308 and a second multi-layer structure 310 attached to first multi-layer structure 308 using an insert molding process. First multi-layer structure 308 and second multi-layer structure 310 are described with respect to FIGS. 1 and 2. First multi-layer structure 308 may include a first layer including at least one protruding feature and at least one recessing feature on an edge of first layer. First multi-layer structure 308 may include a second layer integrally formed on first layer. As shown in FIG. 3, inner layer (e.g., first layer) may not be visible once housing is fabricated. Second layer may include at least one protruding feature 312 and at least one recessing feature 314 on an edge of second layer. Recessing features of first layer may intersect/overlap protruding features 312 of second layer. Second multi-layer structure 310 may be attached to first multi-layer structure 308 through protruding features and recessing features on the edge of first layer and second layer to provide a bonding force in x, y and z directions. For example, the bonding structure may prevent second multi-layer structure (e.g., plastic portion) from moving relative to first multi-layer structure (e.g., metallic body) along an X-axis, a Y-axis, and a Z-axis. For example, the bonding structure (e.g., zipper structure) described herein may improve the bonding strength between the metallic structure and the plastic structure. For example, the multi-layer structure (e.g., formed via protruding features 312 and 316 and recessing features 314 and 318) in FIG. 3 may be shown for illustrative purpose and may not be visible upon performing the painting process on the housing 306. Even though FIG. 3 depicts the assembly structure/bonding structure on a top portion of the base, the assembly structure can be applicable for any other portion of the electronic device such as display cover, bottom portion of the base and the like.

It may be noted that the above-described examples of the present solution is for the purpose of illustration only. Although the solution has been described in conjunction with a specific embodiment thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract and drawings), and/or all of the steps of any method or process so disclosed, may be combined in any combination, except combinations where at least some of such features and/or steps are mutually exclusive.

The terms "include," "have," and variations thereof, as used herein, have the same meaning as the term "comprise" or appropriate variation thereof. Furthermore, the term "based on," as used herein, means "based at least in part on."

Thus, a feature that is described as based on some stimulus can be based on the stimulus or a combination of stimuli including the stimulus.

The present description has been shown and described with reference to the foregoing examples. It is understood, however, that other forms, details, and examples can be made without departing from the spirit and scope of the present subject matter that is defined in the following claims.

What is claimed is:

1. A housing for an electronic device comprising:
   a first multi-layer structure comprising:
      a first layer; and
      a second layer having an ultrasonic bond and formed on the first layer wherein each of the first layer and the second layer comprises a plurality of protruding features and a plurality of recessing features on an edge of the first layer and the second layer, wherein at least one of the plurality of recessing features of one layer attaches at least one of the plurality of protruding features of other layer.

2. The housing of claim 1, further comprising:
   a second multi-layer structure bonded to the first multi-layer structure using the plurality of protruding features and the plurality of recessing features on the edge of the first layer and the second layer.

3. The housing of claim 2, wherein the first multi-layer structure and the second multi-layer structure are made up of a same material or a different material.

4. The housing of claim 2, wherein the second multi-layer structure is made up of a plastic material selected from a group consisting of liquid crystal polymer, polyphenylene sulphide, and poly butylene terephthalate.

5. The housing of claim 1, wherein the first multi-layer structure is made up of a metallic material selected from a group consisting of aluminum, magnesium, lithium, zinc, titanium, aluminum alloy, magnesium alloy, lithium alloy, zinc alloy, and titanium alloy.

6. The housing of claim 1, wherein the plurality of protruding features and the plurality of recessing features of the first layer and the second layer form a dual-layer zipper structure.

7. An assembly comprising:
   a first multi-layer structure comprising:
      a first layer; and
      a second layer having an ultrasonic bond and integrally formed on the first layer, wherein each of the first layer and the second layer comprises at least one protruding feature and at least one recessing feature on an edge of the first multi-layer structure, wherein the at least one recessing feature of one layer attaches the at least one protruding feature of other layer; and
   a second multi-layer structure bonded to the first multi-layer structure via the at least one protruding feature and the at least one recessing feature on the edge of the first multi-layer structure to provide a bonding force.

8. The assembly of claim 7, wherein the second multi-layer structure is insert molded onto the at least one protruding feature and the at least one recessing feature on the edge of the first multi-layer structure.

9. The assembly of claim 7, wherein the first multi-layer structure is made up of a metallic material.

10. The assembly of claim 7, wherein the second multi-layer structure is made up of a plastic material.

11. The assembly of claim 7, wherein the at least one protruding feature of the first layer is substantially offset from the at least one protruding feature of the second layer.

12. The assembly of claim 7, wherein the at least one recessing feature of the first layer is substantially offset from the at least one recessing feature of the second layer.

13. A portable electronic device, comprising:
   at least one electronic component; and
   a housing being arranged to substantially house the at least one electronic component, wherein the housing comprises:
      a first multi-layer structure comprising:
         a first layer comprising at least one protruding feature and at least one recessing feature on an edge of the first layer; and
         a second layer having an ultrasonic bond and integrally formed on the first layer, wherein the second layer comprises at least one protruding feature and at least one recessing feature on an edge of the second layer, wherein the at least one recessing feature of the first layer attaches the at least one protruding feature of the second layer.

14. The portable electronic device of claim 13, wherein the housing comprises:
   a second multi-layer structure attached to the first multi-layer structure through the at least one protruding feature and the at least one recessing feature on the edge of the first layer and the second layer to provide a bonding force in x, y and z directions.

15. The portable electronic device of claim 13, wherein the at least one protruding feature of the first layer is substantially offset from the at least one protruding feature of the second layer, and wherein the at least one recessing feature of the first layer is substantially offset from the at least one recessing feature of the second layer.

* * * * *